United States Patent
Kawanishi

(10) Patent No.: US 8,928,207 B2
(45) Date of Patent: Jan. 6, 2015

(54) TUNING-FORK TYPE QUARTZ-CRYSTAL VIBRATING PIECES AND PIEZOELECTRIC DEVICES HAVING LOW CRYSTAL IMPEDANCE

(75) Inventor: Shingo Kawanishi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 405 days.

(21) Appl. No.: 13/422,913

(22) Filed: Mar. 16, 2012

(65) Prior Publication Data

US 2012/0248938 A1 Oct. 4, 2012

(30) Foreign Application Priority Data

Mar. 29, 2011 (JP) ................... 2011-072755
Jan. 13, 2012 (JP) ................... 2012-005434

(51) Int. Cl.
H03H 9/21 (2006.01)
H03H 9/05 (2006.01)
H03H 9/10 (2006.01)

(52) U.S. Cl.
CPC ............ *H03H 9/21* (2013.01); *H03H 9/0595* (2013.01); *H03H 9/1035* (2013.01)
USPC .......................... 310/370; 310/344

(58) Field of Classification Search
CPC ... H03H 9/21; H03H 2003/026; B06B 1/0659
USPC .............................. 310/370, 344
See application file for complete search history.

(56) References Cited

U.S. PATENT DOCUMENTS 7,521,846 B2 * 4/2009 Tanaya ............... 310/370
7,592,741 B2 * 9/2009 Tanaya et al. ........ 310/370
8,134,284 B2 * 3/2012 Kawanishi ............ 310/370
8,154,178 B2 * 4/2012 Ichikawa et al. ....... 310/344
8,174,171 B2 * 5/2012 Iwai .................. 310/370
2004/0155561 A1 8/2004 Tanaya et al.
2010/0096954 A1 4/2010 Kawanishi et al.
2011/0260586 A1 * 10/2011 Kawase et al. ......... 310/365
2012/0007685 A1 * 1/2012 Yamada ............... 331/156

FOREIGN PATENT DOCUMENTS

CN 101729038 A 6/2010
JP 2010-050960 3/2010
JP 2012039226 A * 2/2012

OTHER PUBLICATIONS

Office Action for related Japanese Patent Application No. 2012-100764567, 8 pages, May 29, 2014 (in Japanese).

* cited by examiner

Primary Examiner — J. San Martin
(74) Attorney, Agent, or Firm — Klarquist Sparkman, LLP

(57) ABSTRACT

Tuning-fork type quartz-crystal vibrating pieces are disclosed, of which the vibration frequency can be adjusted without increasing CI. An exemplary piezoelectric device has a pair of vibrating arms extending in a predetermined direction from a first edge of a base. Respective first grooves are defined in a first principal surface of the vibrating arms. The first grooves extend in the predetermined direction, and have first excitation electrodes extending from a back-edge surface but not completely to a front-edge surface of the grooves. Respective second grooves are defined in a second principal surface, opposite the first principal surface, of the vibrating arms. The second grooves extend in the predetermined direction, and have second excitation electrodes extending from a back-edge surface completely to a front-edge surface of the second grooves.

20 Claims, 12 Drawing Sheets

TUNING-FORK TYPE QUARTZ-CRYSTAL VIBRATING PIECES AND PIEZOELECTRIC DEVICES HAVING LOW CRYSTAL IMPEDANCE

CROSS-REFERENCE TO RELATED APPLICATIONS

This application claims priority to and the benefit of Japan Patent Application No. 2011-072755, filed on Mar. 29, 2011, and Japan Patent Application No. 2012-005434, filed on Jan. 13, 2012, in the Japan Patent Office, the disclosures of which are incorporated herein by reference in their respective entireties.

FIELD

The present invention relates to, inter alia, tuning-fork type piezoelectric vibrating pieces fabricated from piezoelectric substrates, such as quartz-crystal, and having a pair of vibrating arms. The present invention also relates to piezoelectric devices comprising such tuning-fork type piezoelectric vibrating pieces.

DESCRIPTION OF THE RELATED ART

In recent years, as electronic devices have become smaller and thinner, smaller and thinner piezoelectric devices are demanded. Also demanded are piezoelectric devices exhibiting low crystal impedance values (CI-values), high quality, and stability. As tuning-fork type piezoelectric vibrating pieces are increasingly miniaturized, the distance between electrodes become smaller, the sensitivity of vibration frequency increases, and the series resonance capacitance increases. As the vibration frequency sensitivity increases, adjusting the vibration frequency to a desired vibration frequency, (32.768 kHz, for example) is increasingly difficult. Also, as the device is miniaturized, the distance between metal film and excitation electrodes, both situated on the vibrating arms, becomes smaller, which increases the probability of electrical shorts occurring between these structures due to deposition of metal particles.

Japan Unexamined Patent Application No. 2010-050960 discusses a technology of reducing vibration-frequency sensitivity by reducing the length of an electrode situated within the respective groove of a vibrating arm. Specifically, the length is reduced to less than 55% of the length of the vibrating arm. With this approach, the vibration-frequency sensitivity has been reduced to less than 15 ppm/pF. Unfortunately, these actions have resulted in undesired increases in the CI of the piezoelectric devices. As a result, there is substantial demand for tuning-fork piezoelectric vibrating devices having reduced vibration-frequency sensitivity and reduced CI.

SUMMARY

The present invention provides, inter alia, tuning-fork type quartz-crystal vibrating pieces, and piezoelectric devices comprising same, of which the vibration frequency can be easily adjusted without increasing CI.

A first aspect of the present invention relates to tuning-fork type piezoelectric devices. An exemplary embodiment of such a device comprises first and second vibrating arms extending from a first edge of a base in a predetermined direction and having respective weights on each tip thereof. Respective first grooves are defined on the first principal surfaces of the vibrating arms. The first grooves are recesses that extend depthwise from the respective first principal surfaces and also extend in the predetermined direction. Respective second grooves are defined on second principal surfaces, opposite the first principal surfaces, of the vibrating arms. The second grooves are recesses that extend depthwise from the respective second principal surfaces and also extend in the predetermined direction. The first and second grooves each have respective sides, a respective lower main surface, a respective back-edge surface nearer the base, and a respective front-edge surface nearer the weight. The first grooves include respective first excitation electrodes that extend over the respective back-edge surface and on the respective sides and lower main surface toward the respective front-edge surface but not including the respective front-edge surface. The second grooves include respective second excitation electrodes that extend over the respective back-edge surface to the respective front-edge surface, including the respective front-edge surface, respective side surfaces, and respective lower main surfaces.

Each weight desirably comprises a first metal film formed with a first thickness on the tip of each vibrating arm. Each weight also desirably comprises a second metal film formed with a second thickness over the first metal film. The second principal surface desirably is larger than the first principal surface, and the excitation electrodes desirably have the first thickness. The weights desirably are wider than the respective vibrating arms.

In certain embodiments each first excitation electrode has a length in a range of 60%-90% the length of the respective first groove.

In some embodiments the first grooves and second grooves each include a respective constriction situated between the back-edge surface and front-edge surface. The constriction extends in a direction that crosses the predetermined direction and narrows the respective groove.

The vibrating pieces desirably further comprise a respective supporting arm situated outboard of each vibrating atm. The supporting arms extend in the predetermined direction relative to the base and include respective bonding regions by which the vibrating piece is mountable using electrically conductive adhesive.

The vibrating pieces desirably further comprise an outer frame surrounding the vibrating arms and base in two dimensions including the predetermined direction. In these embodiments, a respective supporting arm, if present, is situated outboard of each vibrating arm. The supporting arms extending in the predetermined direction relative to the base, and the supporting arms are connected to the outer frame.

According to another aspect, piezoelectric devices are disclosed. An exemplary embodiment of such a device comprises a tuning-fork type quartz-crystal vibrating piece as summarized above, a base plate, and a lid. The base plate is situated opposite the second principal surface of the tuning-fork type piezoelectric vibrating piece, to which the tuning-fork type piezoelectric vibrating piece is mounted. The lid is mounted to the first principal surface of the tuning-fork type piezoelectric vibrating piece.

Tuning-fork type quartz-crystal vibrating pieces as disclosed herein meet current market demands for miniaturized piezoelectric devices, in which the length of the excitation electrode on the first principal surface has been reduced relative to the respective groove, while the excitation electrode on the second principal surface extends the full length of the respective groove.

DETAILED DESCRIPTION

Various embodiments of the subject invention are described in detail below, with reference to the accompanying drawings. In the following description, the direction in which the vibrating arms of a tuning-fork crystal vibrating piece extend is the Y-axis direction. The direction of width of the vibrating arms is the X-axis direction. The direction normal to both the X-axis and the Y-axis is the Z-axis direction. The tuning-fork type quartz-crystal vibrating piece of this embodiment is a vibrating piece that oscillates at, for example, 32.768 kHz. The vibrating piece is relatively small, with representative dimensions of 1.45 mm in the Y-axis direction, 0.5 mm in the X-axis direction, and 0.12 mm in the Z-axis (thickness) direction.

First Embodiment

Figure 1A:
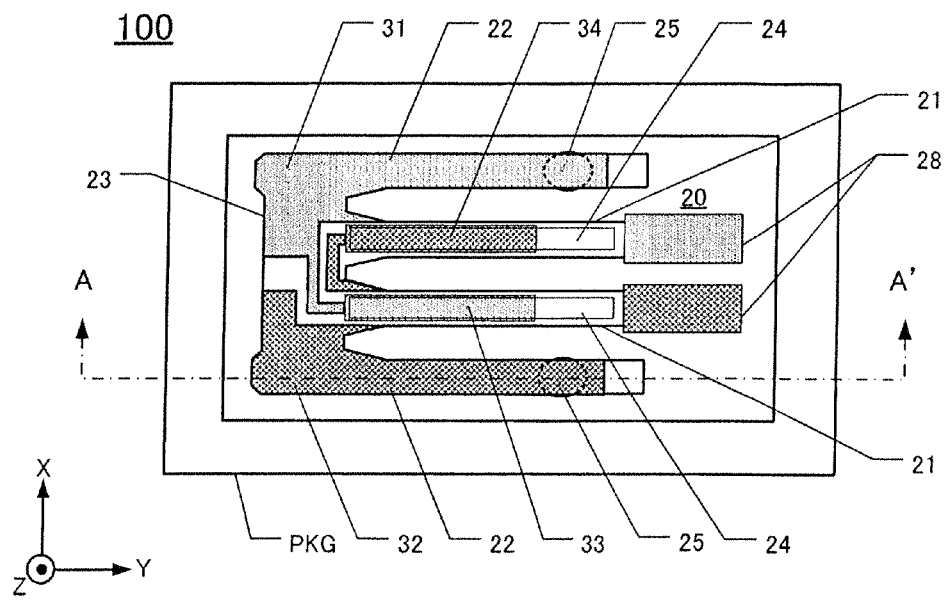
FIG. 1A is a plan view of a first embodiment of a quartz-crystal device from which the lid has been removed to reveal underlying detail.
Figure 1B:
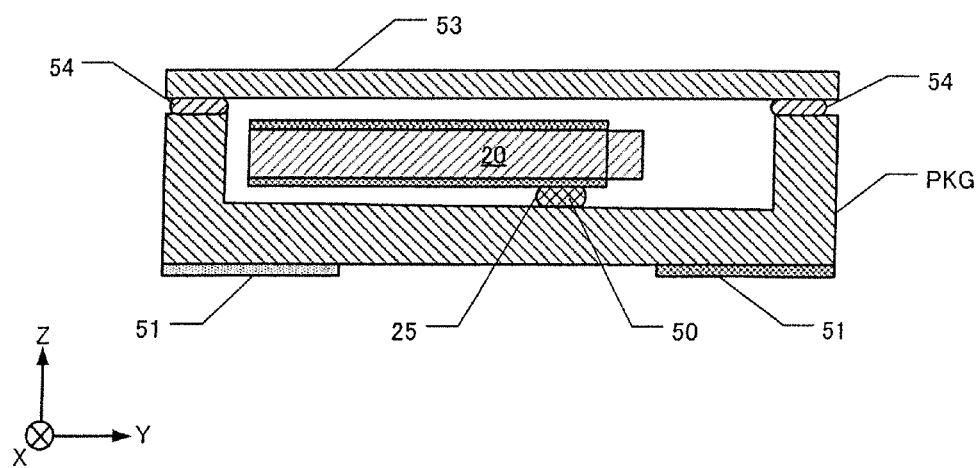
FIG. 1B is a cross-section of the embodiment of FIG. 1A, along the line A-A' in FIG. 1A.

FIG. 1A is a plan view of a quartz-crystal device 100 according to this embodiment, in which the lid 53 has been removed to reveal underlying detail. FIG. 1B is a cross-section along the line A-A' in FIG. 1A.

The quartz-crystal device 100 comprises a package lid 53, a package PKG, and a first embodiment of a tuning-fork type quartz-crystal vibrating piece 20. The vibrating piece 20 is contained in a vacuum in a recess defined in the package PKG. The lid 53 and package PKG are sealed together under vacuum using a sealing material 54. By fabricating the package lid 53 of borosilicate glass, vibration frequency can be adjusted even after assembling the quartz-crystal device.

The package PKG is fabricated from a ceramic material, for example, formed by stacking multiple ceramic sheets in a box shape. External electrodes 51 are situated on the lower main surface of the package PKG. The package PKG is a surface-mountable (SMD) type.

As shown in FIG. 1A, the first tuning-fork type quartz-crystal vibrating piece 20 comprises a pair of vibrating arms 21, a pair of respective supporting arms 22, and a base 23. Base electrodes 31, 32 are situated on the base 23. Each vibrating arm includes respective grooves 24 on its upper surface and lower surface. Respective excitation electrodes 33, 34 are formed on the upper and lower surfaces and side surfaces of each vibrating arm. The distal end of each vibrating arm 21 includes a respective weight fabricated as, for example, a gold film (hereinafter referred as a "metal-film weight" 28). A respective bonding portion 25 situated on each supporting arm 22 is bonded to the package PKG using electrically conductive adhesive 50.

The vibration frequency of the quartz-crystal device 100 can be adjusted by increasing or decreasing the mass of the vibrating arms. The amount of metal in the metal-film weight 28 on each vibrating arm 21 can be adjusted by adding metal to the metal-film weight 28 or by irradiating an ion beam or laser beam onto the metal-film weight 28 to remove a selected portion of the metal film. Following these steps, the quartz-crystal device 100 is manufactured, pending the outcome of a quality check.

Figure 2A:
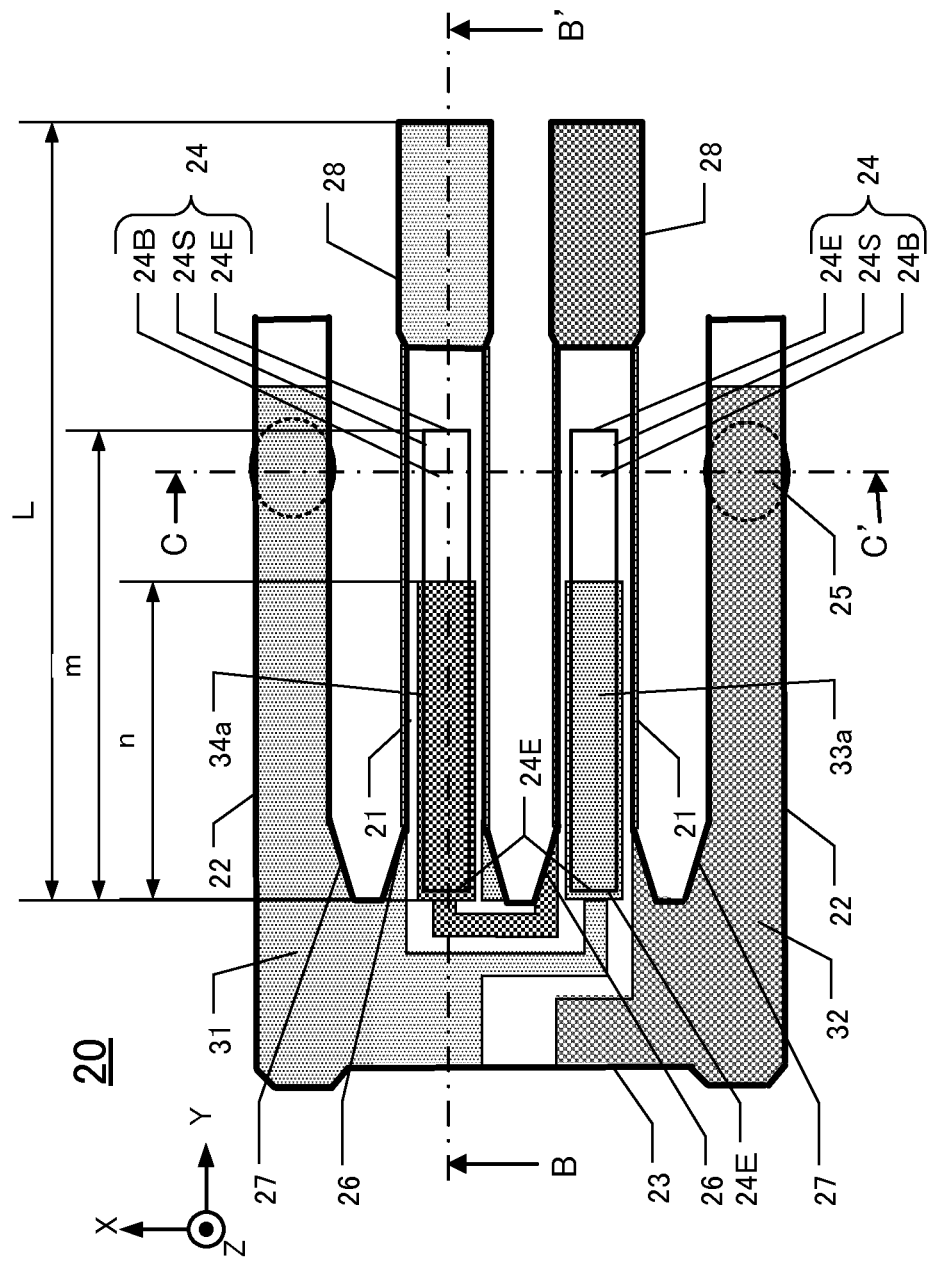
FIG. 2A is a plan view of the tuning-fork type quartz-crystal vibrating piece used in the first embodiment, as viewed from above the first principal surface (upper surface) thereof.
Figure 2B:
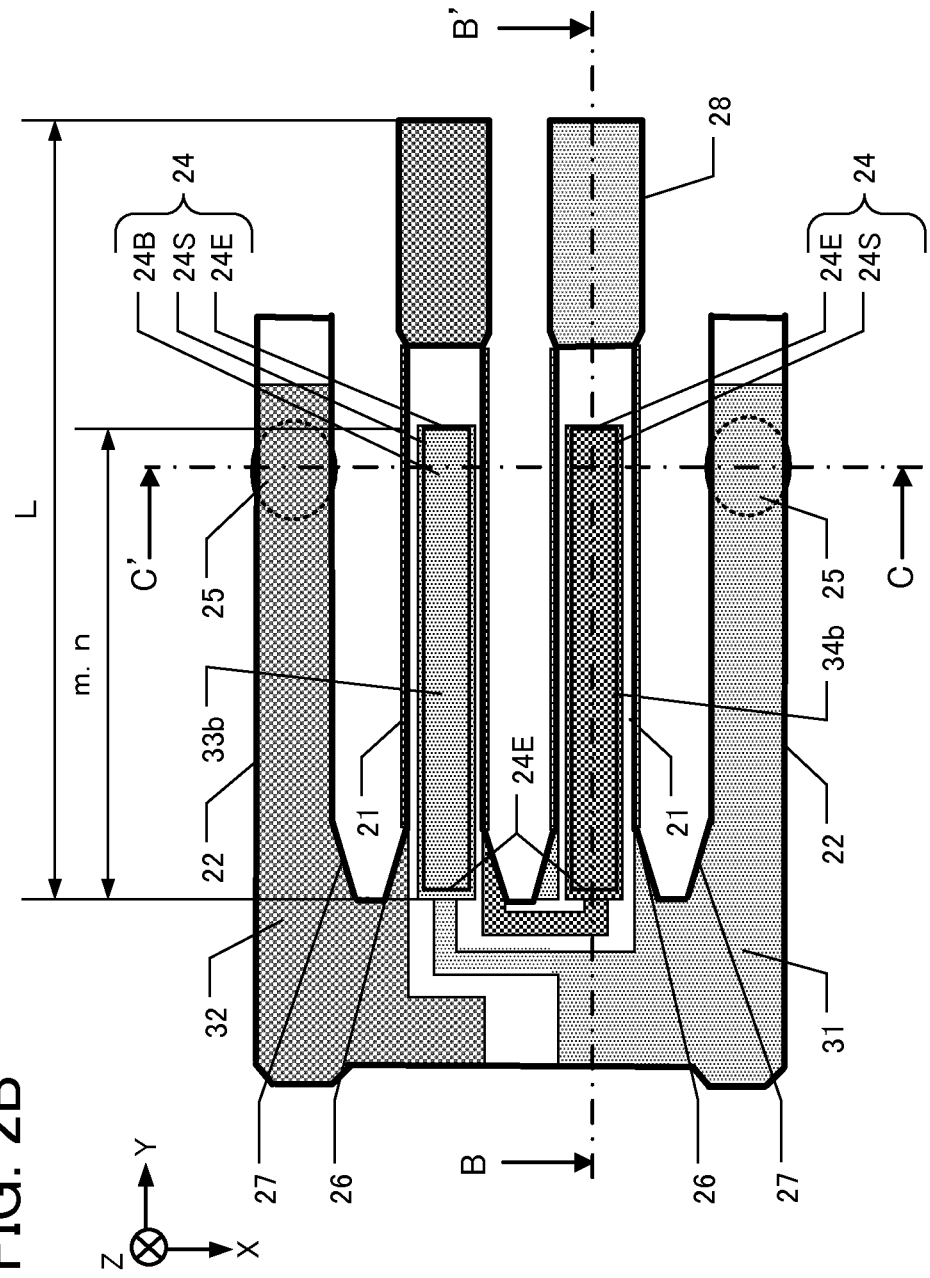
FIG. 2B is a plan view of the tuning-fork type quartz-crystal vibrating piece used in the first embodiment, as viewed from below the second principal surface (lower surface) thereof.

The first embodiment 20 of a tuning-fork type quartz-crystal vibrating piece is shown in plan view in FIG. 2A, as viewed from above its first principal surface (upper surface). FIG. 2B is a plan view of the tuning-fork type quartz-crystal vibrating piece 20 as viewed from below its second principal surface (lower surface). The vibrating piece 20 comprises a pair of excitation electrodes 33 (33a, 33b) and 34 (34a, 34b) situated within the respective grooves 24 of the vibrating portion 21. Respective metal-film weights 28 are situated on the tip of each vibrating arm 21.

The vibrating arms 21 extend from the base 23 parallel to each other in the Y-axis direction. A respective groove 24 is formed on the upper surface of each vibrating arm 21. Similarly, a respective groove 24 is formed on the lower surface of each vibrating arm 21. The distal end of each vibrating arm 21 is wider than other portions of the vibrating arm; this configuration is termed "hammer"-shaped. The hammer-shaped features constitute the metal-film weights 28. The metal-film weights 28, when present, reduce the vibration frequency of the vibrating arms (which otherwise would vibrate at a higher frequency due to their miniaturization). The metal-film weights are situated to allow easy adjustment of the frequency of the vibrating arms by adding mass to or removing mass from the weights.

The conjunction of the vibrating arms 21 with the base 23 forms respective "root portions" 26 that, in this embodiment, form respective sides of a straight-sided U. The vibrating piece 20 also comprises respective supporting arms 22 located outboard of the vibrating arms 21. The conjunction of the supporting arms 22 with the base 23 forms respective supporting-root portions 27 that also form respective sides of a straight-sided U. Although the vibrating-root portions 26 and supporting-root portions 27 in this embodiment are straight, they alternatively can have a more curvaceous U-shape.

The base 23 in this embodiment 20 has a roughly rectangular shape. The length of the base 23 in the Y-direction is desirably as short as possible, so that the entire length of the vibrating piece 20 can be correspondingly reduced. However, reducing the length of the base can cause unwanted transmission of vibrations from the vibrating arms 21 to outside the package, which increases the vulnerability of the vibrating piece 20 to thermal changes or external impacts. The supporting arms 22 help reduce these effects.

The supporting arms 22 extend from respective lateral edges of the base 23 of this embodiment 20. The supporting arms 22 are shorter than the vibrating arms 21.

The vibrating piece 20 is mounted to and bonded to the package PKG at respective bonding regions 25 on the supporting arms 22. The bonding regions 25 are bonded using electrically conductive adhesive 50. Since the bonding portions 25 are situated on the supporting arms 22 away from the base 23, the resulting piezoelectric device is less affected by vibrations and changes in the external environment.

The dimensions of the vibrating piece 20 are as follows. The length L denotes the length of the vibrating arms 21 from the base 23. L is approximately 1.25 mm, for example. The length m, denoting the length of the grooves 24, is approximately 70% the length L of the vibrating arms (i.e., m≈(0.7)L). The length m is the Y-direction distance from a first-edge surface 24E (closer to the base 23) to a second-edge surface 24E (closer to the weight portion 28). The first-edge surface 24E is referred to herein as the "back-edge surface," and the second-edge surface 24E is referred to herein as the "front-edge surface." The excitation electrodes 33a and 34a on the upper surface extend in the +Y-direction from the back-edge surface 24E, but not fully to the front-edge surface 24E. The length n, denoting the length of the excitation electrodes 33a, 34a on the upper surface, is approximately 60% to 80% the length m of the groove 24 (i.e., n≈(0.6)m to (0.8)m).

As shown in FIG. 2B the length m (distance from the back-edge surface 24E to the front-edge surface 24E) of the groove 24 on the lower surface is approximately 70% the length L of the vibrating portion 21 (i.e., m (0.7)L). The length n of the excitation electrodes 33b, 34b on the lower surface is 100% the length m of the groove 24 (i.e., n=m). Thus, on the lower surface the excitation electrodes 33b, 34b have the same length as the groove 24. The length (Y-direction) of the base 23 is approximately 0.20 mm.

Figure 3A:
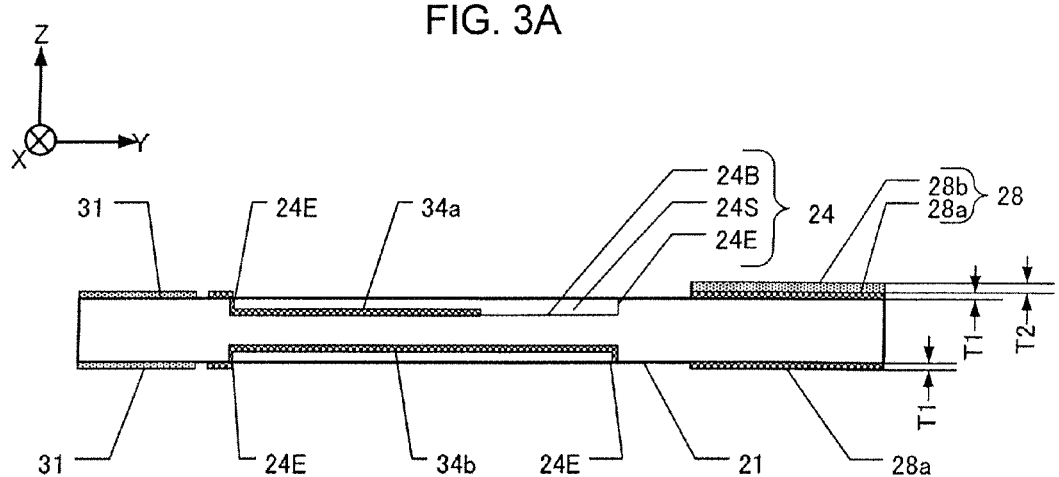
FIG. 3A is a cross-section of the tuning-fork type quartz-crystal vibrating pieces shown in FIGS. 2A and 2B, along the line B-B' in each of FIGS. 2A and 2B.
Figure 3B:
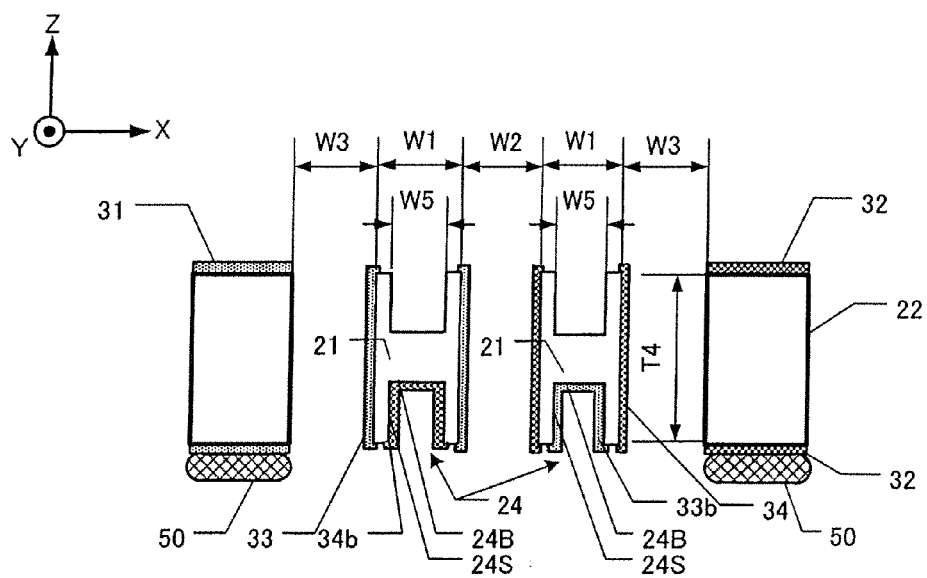
FIG. 3B is a cross-section of the tuning-fork type quartz-crystal vibrating pieces shown in FIGS. 2A and 2B, along the line C-C' in each of FIGS. 2A and 2B.

FIG. 3A is a cross-section of the vibrating piece 20 of FIGS. 2A and 2B, along the line B-B'. FIG. 3B is a cross-section of the vibrating piece 20 in FIGS. 2A and 2B along the line C-C'.

As shown in FIG. 3A, on the upper surface (+Z-surface) of the respective vibrating arm 21 is a base electrode 31, an excitation electrode 34a, and a weight 28. Similarly, a base electrode 31, excitation electrode 34a, and weight 28 are situated on the lower surface (−Z-surface) of the vibrating arm 21. Each vibrating arm 21 has a respective metal-film weight 28a situated on the upper and lower surfaces thereof. The metal-film weights 28a and the vibrating arms 21 are formed in conjunction with formation of the base electrode 31 and excitation electrode 34. The excitation electrodes 34a, 34b have the same thickness T1 as the metal-film weight 28a. On the upper surface, the metal-film weight 28a includes a superposed metal-film weight 28b having a thickness T2. The metal-film weights 28b prevent the vibration frequency from becoming excessively high as the device is miniaturized.

The excitation electrodes 34b situated on respective lower surfaces of the vibrating arms 21 have the same length as the groove 24. Excitation electrodes 33, 34 are also situated on the side surfaces of the vibrating arms 21, the wall surfaces 24S of the groove 24, and the bottom surfaces 24B of the grooves. The base electrodes 31, 32 and the excitation electrodes 33, 34 have double-layer construction, including a foundation layer of chromium (Cr) and overlying layer of gold (Au).

As shown in FIG. 3B, the X-direction distance W2 between the vibrating arms 21 of the vibrating piece 20 is equal to the width W1 of one vibrating arm 21. The X-direction width W3 of the space between the vibrating arm 21 and its respective supporting arm 22 is equal to W1. Thus, in the vibrating piece 20, the W1=W2=W3.

The grooves 24 provide each vibrating arm 21 with an H-shaped cross-section. The X-direction width W5 of each groove 24 (i.e., distance between adjacent wall surfaces 24S of the groove) is in the range of 40% to 80% the width W1 of each vibrating arm 21 (i.e., W5≈(0.4)W1 to (0.8)W1). The thickness T4 of each vibrating arm 21 is more than twice the thickness W1 of the vibrating arm 21. The outline profile and contour of the vibrating piece 20 and its grooves 24 are formed by photolithography and etching, which is a common technique for such purpose.

Referring further to FIG. 3B, the grooves 24 on the upper surface (+Z-surface) of the vibrating portion 21 do not include excitation electrodes 33, 34. Respective excitation electrodes 33b, 34b are formed on the walls and bottom surface of the grooves 24 on the lower surface (−Z-surface) of each vibrating arm 21. Respective excitation electrodes 33b, 34b are also situated on the side surfaces of each vibrating arm 21, the wall surfaces 24S of the grooves 24, and bottom surface 24B of the grooves 24.

Figure 4:
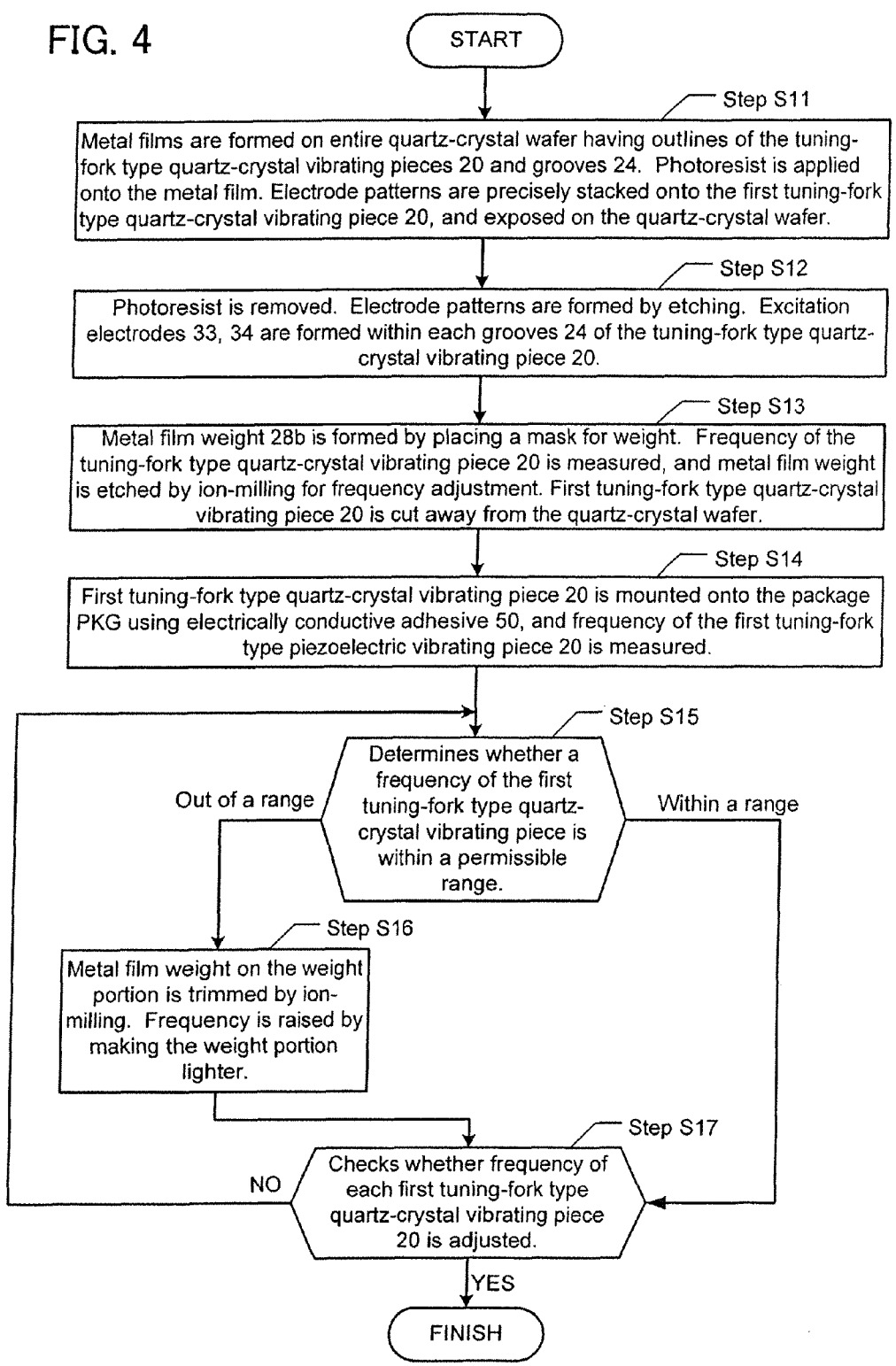
FIG. 4 is a flow-chart of steps of an embodiment of a method for manufacturing electrodes on the first embodiment of a tuning-fork type quartz-crystal vibrating piece.

FIG. 4 is a flow-chart of an embodiment of a method for forming the electrodes on the first embodiment of a tuning-fork type quartz-crystal vibrating piece 20. This flow-chart also includes steps for adjusting the vibration frequency of the vibrating arms 21. The electrodes are shaped by photolithography.

In step S11, a metal film is formed on an entire quartz-crystal wafer having outline profiles of multiple vibrating pieces 20 and respective grooves 24. The metal film is formed by vacuum-deposition or sputtering. Then, a layer of photoresist is applied to the metal film. An electrode mask, defining patterns of the base electrodes 31, 32 and excitation electrodes 33, 34, is precisely aligned with the outline profiles of the vibrating pieces. An exposure tool (not shown) is used to expose the electrode patterns onto the vibrating pieces 20.

In step S12, after removing the exposed photoresist, the electrode patterns are formed by etching the underlying metal films. Thus, the excitation electrodes 33, 34 are formed on the vibrating pieces 20. The excitation electrodes 33, 34, formed in the respective grooves 24 on the first principal surface (upper surface), extend from the back-edge surface 24E (see FIGS. 2 and 3) to approximately 60% to 80% the length m of the groove 24. The excitation electrodes 33b, 34b extend the full length of the respective grooves 24 on the second principal surface (lower surface). During formation of these electrode patterns, the metal-film weights 28a (see FIG. 3A) are also formed. Respective metal-film weights 28a are formed on the upper surface and lower surface of the tip of each vibrating arm 21. Each metal film has a thickness T1 equal to the thickness of the base electrodes 31, 32 and excitation electrodes 33, 34.

In step S13, respective metal-film weights 28b (see FIG. 3A) are formed on the first principal surface (upper surface) of each vibrating piece 20. To such end a mask defining the weights is placed on the first principal surface of the quartz-crystal wafer. The mask defines openings corresponding only to respective weights. Using the mask, the metal-film weights 28b are formed by vacuum-deposition or sputtering. The mask for weights prevents metal particles from adhering anywhere other than desired regions of the metal film during sputtering. In conventional methods, when placing a weight mask onto the quartz-crystal wafer, gaps may form between the wafer and the mask. At these gaps, metal particles may enter the grooves 24. If the excitation electrodes 33a, 34a, situated within the grooves 24 of the first principal surface, extend completely to the front-edge surfaces 24E, electrical shorting can occur by adhesion of metal particles on the excitation electrodes 33a, 34a. By forming the excitation electrodes 33a, 34a on the first principal surface of the vibrating piece 20 so that the electrodes do not extend completely to the front-edge surface 24E, conditions that otherwise form electrical shorts between the excitation electrodes are prevented.

The oscillation frequency produced by the vibrating piece 20 including the metal-film weights 28b is measured using a frequency-adjustment device (not shown). If adjustment is required, predetermined locations on the metal-film weights 28b are removed by ion-milling, for example. During ion-milling, a beam of accelerated ions is passed through a selected metal-film weight 28b, from which the beam ablates metal particles. The resulting removal of mass from the metal-film weights 28b correspondingly increases the oscillation frequency of the vibrating piece 20. During mass-production of multiple vibrating pieces 20 on a quartz-crystal wafer, the vibration frequency of each vibrating piece 20 is roughly adjusted to within a permissible range (in which the current vibration frequency is lower than the target frequency). After making this adjustment, the vibrating pieces are cut from the wafer.

In step S14, the vibrating piece 20 is mounted on (and in) the package PKG using electrically conductive adhesive 50. Afterward, the oscillation frequency produced by the first vibrating piece 20 is measured using a frequency-adjustment device (not shown).

In step S15, a determination is made of whether the oscillation frequency produced by the vibrating piece 20 is within a permissible range. If the vibration frequency is within the permissible range, then the process advances to step S17. If the oscillation frequency is below the permissible range, then the process advances to step S16.

In step S16, the metal-film weights 28b on the first principal surface of the vibrating piece 20 are finely trimmed by ion-milling or other suitable technique. During ion-milling, metal particles are ablated from the metal-film weights 28b. Since the excitation electrodes 33a, 34a situated on the first principal surface of the vibrating piece 20 do not extend completely to the front-edge surface 24E of the grooves, the probability of these ablated particles causing an electrical short between the excitation electrodes is substantially reduced.

Step S17 involves a check of whether the oscillation frequency of the vibrating piece 20, whether previously adjusted or not, is now within range. If the frequency requires adjustment but has not yet been adjusted, the process returns to step S15. If the frequency does not require adjustment or further adjustment, then frequency-adjustment is completed.

Length of Excitation Electrodes on Upper Principal Surface

Figure 5:
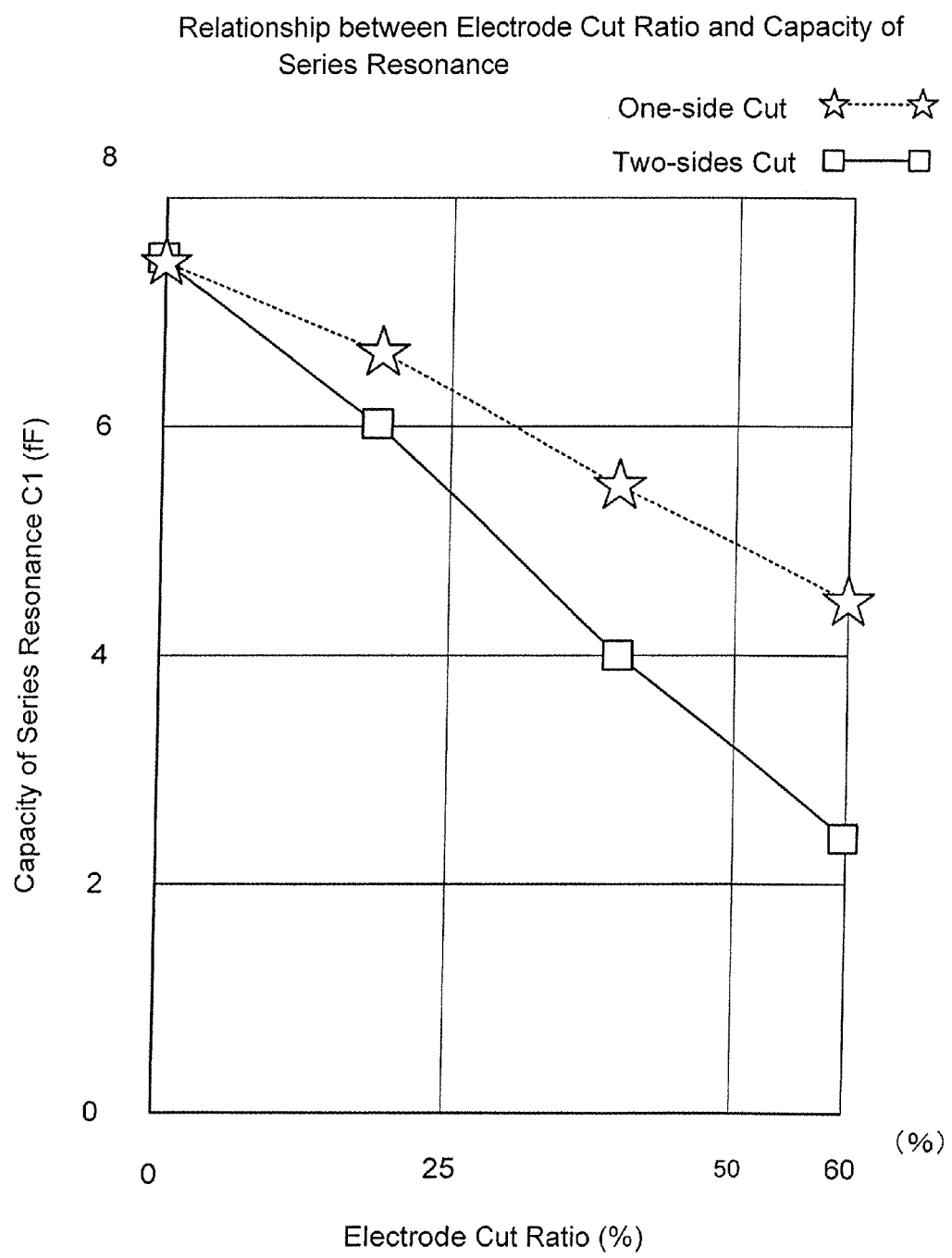
FIG. 5 is a graph showing a relationship of the series resonance capacitance C1 to electrode-cut ratio.

FIG. 5 is a graph showing an exemplary relationship of the series-resonance capacitance ("C1"; in units of fF) to the "electrode-cut ratio" (%). The ordinate is C1, and the abscissa is the electrode-cut ratio. The electrode-cut ratio is calculated as (m−n)/m, where m and n are as shown in FIGS. 2A and 2B and discussed above. The length (m−n) denotes the length of the portion of the groove 24 lacking a respective excitation electrode 33, 34. Thus, the electrode-cut ratio denotes the percentage of the groove length that is not occupied by an excitation electrode 33, 34.

FIG. 5 includes line graphs for a one-side cut and a two-side cut. A vibrating piece 20 having a one-side cut has shortened excitation electrodes 33, 34 in the grooves cut into the first principal surface (upper surface), but the excitation electrodes 33, 34 in the grooves on the second principal surface have the same length as the respective grooves. A vibrating piece having a two-side cut has its excitation electrodes on both principal surfaces be the same length as the respective grooves.

As the series-resonance capacitance C1 is reduced, the sensitivity S to vibration-frequency variation (the sensitivity is in units of ppm/pF) is also reduced. Since the tuning-fork type quartz-crystal vibrating piece 20 oscillates at 32.768 kHz, the series-resonance capacitance C1 of the vibrating piece is desirably less than 7 fF. As a result, the cut ratio of the one-side cut vibrating piece 20 desirably is greater than 10%. Therefore, the length n of the electrode situated on the first principal surface of the vibrating piece 20 desirably is less than 90% of the length m of the groove 24.

Figure 6:
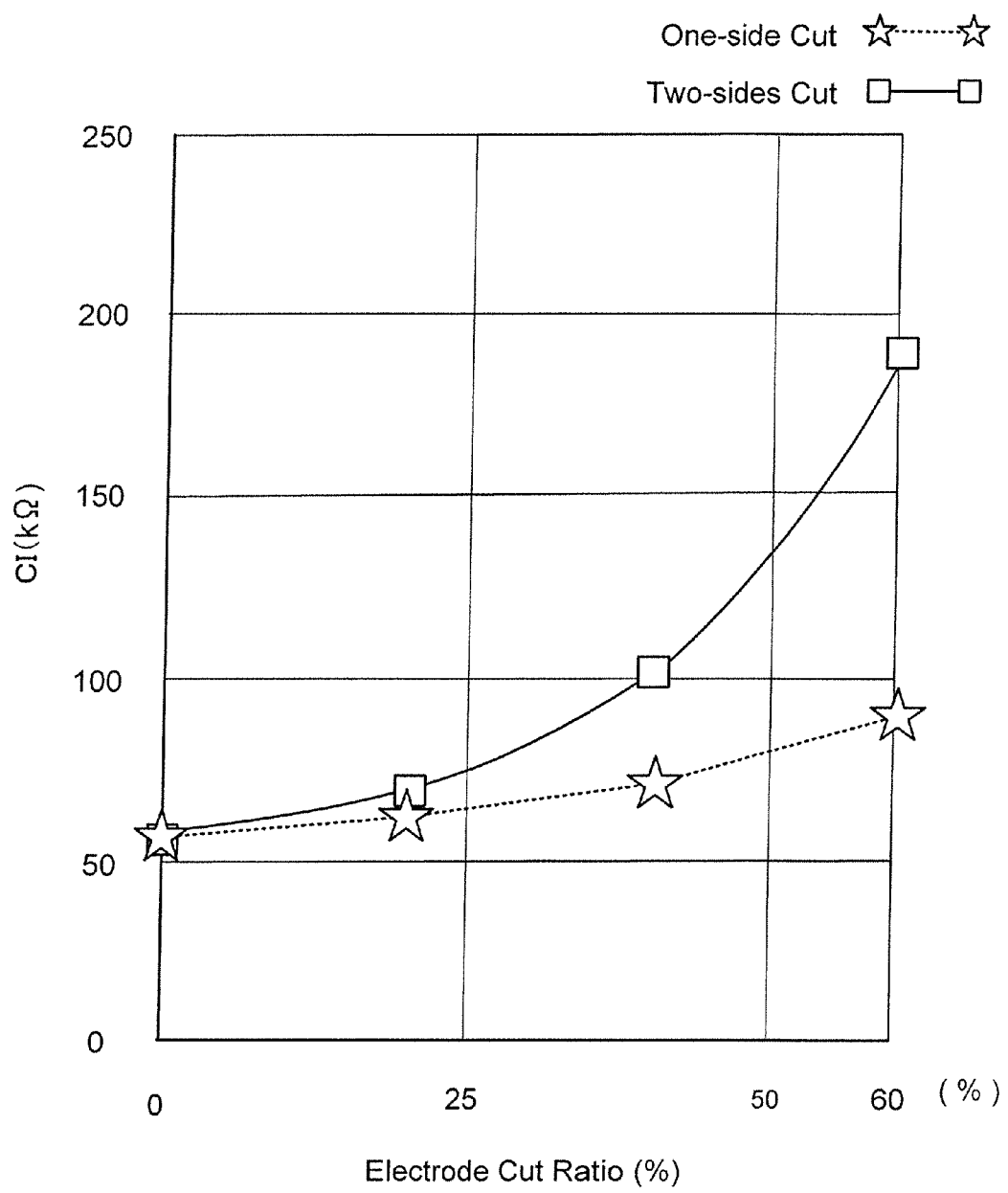
FIG. 6 is a graph showing a relationship of the CI-value (crystal impedance value) to electrode-cut ratio.

FIG. 6 is a graph showing an exemplary relationship of the crystal impedance CI (in units of kΩ) to the electrode-cut ratio. The crystal impedance is the ordinate, and the cut ratio is the abscissa. The CI desirably is as low as possible, preferably less than 70 kΩ. As a result, the one-side cut ratio of the vibrating piece 20 desirably is less than 40%. This places n (length of the excitation electrode on the first principal surface of the vibrating piece 20) at desirably greater than 60% the length m of the groove 24.

Figure 7:
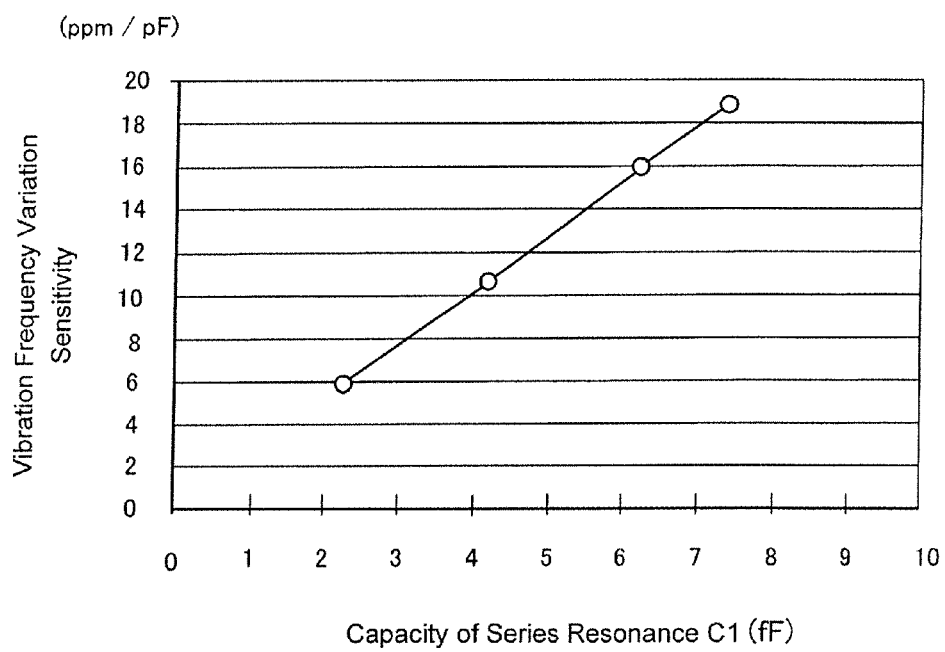
FIG. 7 is a graph showing a relationship of sensitivity (S) to vibration-frequency variation to series resonance capacitance C1.

FIG. 7 is a graph showing an exemplary relationship of the vibrating piece sensitivity (S; in units of ppm/pF) to vibration-frequency variation to series-resonance capacitance C1. As C1 is reduced, S is also reduced. Since the vibrating piece 20 of this embodiment oscillates at 32.768 kHz, the series-resonance capacitance C1 is preferably less than 7 fF. Whenever the series-resonance capacitance C1 is adjusted to less than 7 fF, the sensitivity S to vibration-frequency variation becomes less than 16 ppm/pF, which makes frequency adjustment easier to perform.

According to the data shown in FIGS. 5-7, the length n of the excitation electrode on the first principal surface of the vibrating piece 20 is preferably less than 90% of the length m of the groove 24. With respect to CI, the length n of the excitation electrode on the first principal surface of the vibrating piece 20 is preferably more than 60% of the length m of the groove 24. Therefore, the length n is preferably greater than 60% and less than 90% of the length m.

FIGS. 5 and 6 show a linear relationships for two-sides cut vibrating pieces of which the excitation electrodes have equal length on both upper and lower principal surfaces. By making the length of the excitation electrodes of a two-sides cut vibrating piece less than 90% the length m of the groove, the series-resonance capacitance C1 becomes less than 7 fF. On the other hand, to reduce CI to less than 70 kΩ, the length of the excitation electrodes on a two-side's cut vibrating piece should be greater than 80% the length m of the groove. Therefore, the length of excitation electrodes of a two-sides cut vibrating piece is preferably more than 80% and less than 90% of the length m of the groove.

Comparing the one-side cut vibrating piece 20 to the two-sides cut vibrating piece, the following can be deduced: The length n of the excitation electrodes situated on the vibrating piece 20 with one-side cut is more than 60% and less than 90% the length m of the groove 24, which provides a 30% length-adjustment range. On the other hand, the length of the excitation electrodes situated on the vibrating piece with two-sides cut is more than 80% and less than 90% of the length of the groove 24, which provides only a 10% adjustment range. Thus, the adjustability range for an excitation electrode on a one-side cut vibration piece is at least twice the adjustment range for excitation electrodes on a two-sides cut vibration piece.

When forming excitation electrodes 33, 34 on the quartz-crystal vibrating piece 20, electrode masks may be misaligned on the quartz-crystal wafer. However, the tuning-fork type quartz-crystal vibrating piece 20 of this embodiment provides a sufficient adjustment range that substantially reduces the probability of significant misalignments. Also, from a manufacturing point of view, the excitation electrodes 33a, 34a, on the vibrating piece 20 preferably face upward. With excitation electrodes in such an orientation, metal particles produced by sputtering or the like are less likely to become attached to the excitation electrodes 33a, 34a during steps S13 and S17 in FIG. 4. Also, as set forth in step S16 in FIG. 4, metal particles produced by ion milling are less likely to become attached to the excitation electrodes 33a, 34a.

Second Embodiment

Figure 8A:
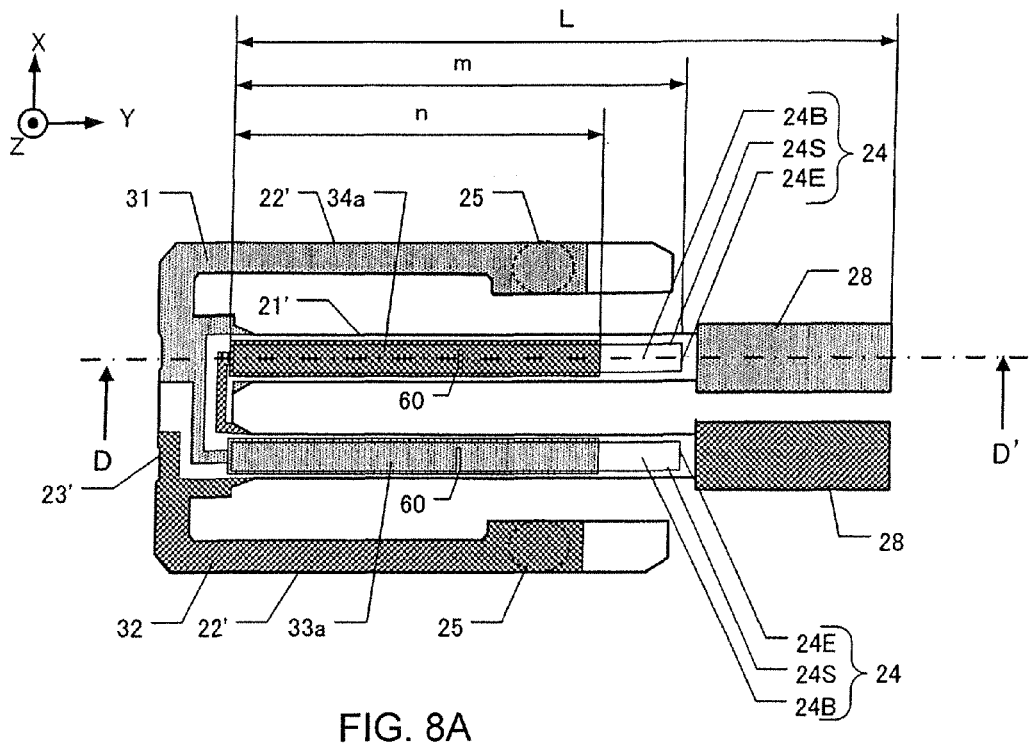
FIG. 8A is a plan view of a second embodiment of a tuning-fork type quartz-crystal vibrating piece.
Figure 8B:
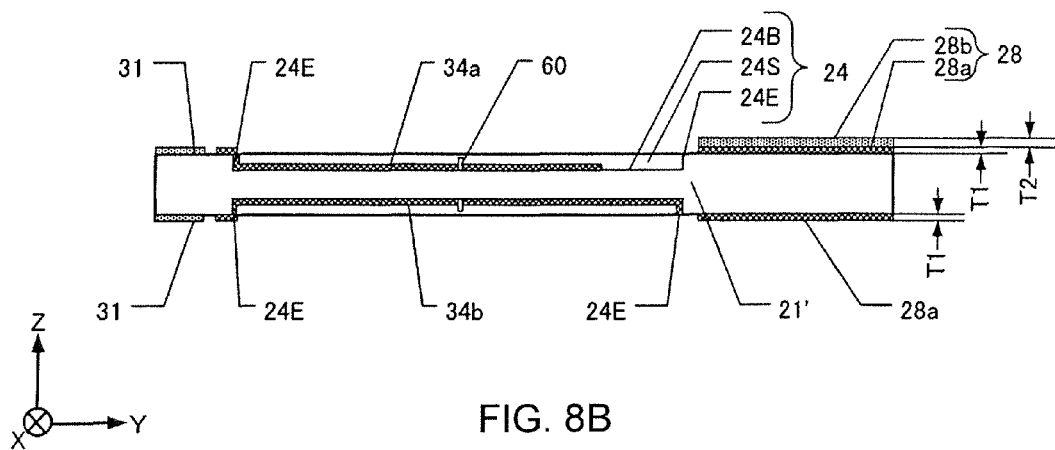
FIG. 8B is a cross-section of the tuning-fork type quartz-crystal vibrating piece shown in FIG. 8A, along the line D-D' in FIG. 8A.

FIG. 8A is a plan view of a second embodiment of a tuning-fork type quartz-crystal vibrating piece 20A, and FIG. 8B is a cross-section of the vibrating piece 20A along the line D-D' in FIG. 8A. The shapes of the supporting arms 22' and the base 23' of the second embodiment of a vibrating piece 20A differ from corresponding shapes in the first embodiment 20. In FIG. 20A, the vibrating arms 21' comprise respective constrictions 60 within the grooves 24. Other features of the second embodiment 20A are the same as in the first embodiment 20, and such similar features have the same respective reference numerals and are not described further below.

The vibrating piece 20A comprises a pair of vibrating arms 21', a pair of supporting arms 22', and a base 23'. The vibrating arms 21' extend from the base 23' in the Y'-axis direction. Respective grooves 24 are defined on each principal surface of the vibrating arms 21'. In each groove 24, respective constrictions 60 are formed that narrow the respective groove 24 in the X-axis direction. The constrictions 60 are formed on the −X-surfaces of the side walls 24S of the grooves 24. The constrictions 60 are also formed in the grooves 24 situated on the second principal surface of the vibrating arms.

The constrictions 60 are situated at mid-length (m/2) of the length of each groove 24. The constrictions 60 increase the rigidity of the base of the vibrating piece 20A and prevent decreases of the CI during generation of second harmonic vibrations.

The root portions of the vibrating arms 21' fan out in the X-axis direction. These vibrating arms 21' are thus substantially free from stresses concentrated on the root portions and exhibit reduced vibration leakage to the base 23'.

As shown in FIG. 8A, supporting arms 22' extend in the −Y'-axis direction from the base 23', and extend in respective X-axis directions before turning to extend parallel to the +Y'-axis direction. The distal tip of each supporting arm 22' is slightly expanded in width and comprises a respective bonding region 25. The bonding regions 25 are used for bonding the second embodiment of a vibrating piece 20A to (and in) the package, and are situated on the wider distal regions of the supporting arms 22'. Since the bonding portions 25 are situated outboard of the base 23', the device is less affected by the external vibrations and other changes in the external environment.

The length m of the groove 24 is approximately 70% the length L of the vibrating arm 21'. The length m of the groove 24 extends from the edge 24E on the base (back edge) to the opposing edge 24E (front edge). Excitation electrodes 33a, 34a on the upper surface extend from the back edge 24E in the Y-axis direction; but, the excitation electrodes do not extend entirely to the front edge 24E. As shown in FIG. 8A, the length n of each excitation electrode 33a, 34a situated on the upper surface is approximately 70% to 90% the length m of the groove 24.

As shown in FIG. 8B, the length n of the excitation electrodes 33b, 34b situated on the lower surface is 100% the length of the groove 24. Thus, the excitation electrodes 33b, 34b have the same length as the groove 24.

An embodiment of a method for manufacturing the second embodiment of a tuning-fork type quartz-crystal vibrating piece 20A essentially follows the method in the first embodiment (FIG. 4). When forming the grooves 24 in the second embodiment, the constrictions 60 are formed by not etching material destined to be the constriction 60 while etching surrounding material.

Third Embodiment

Figure 9A:
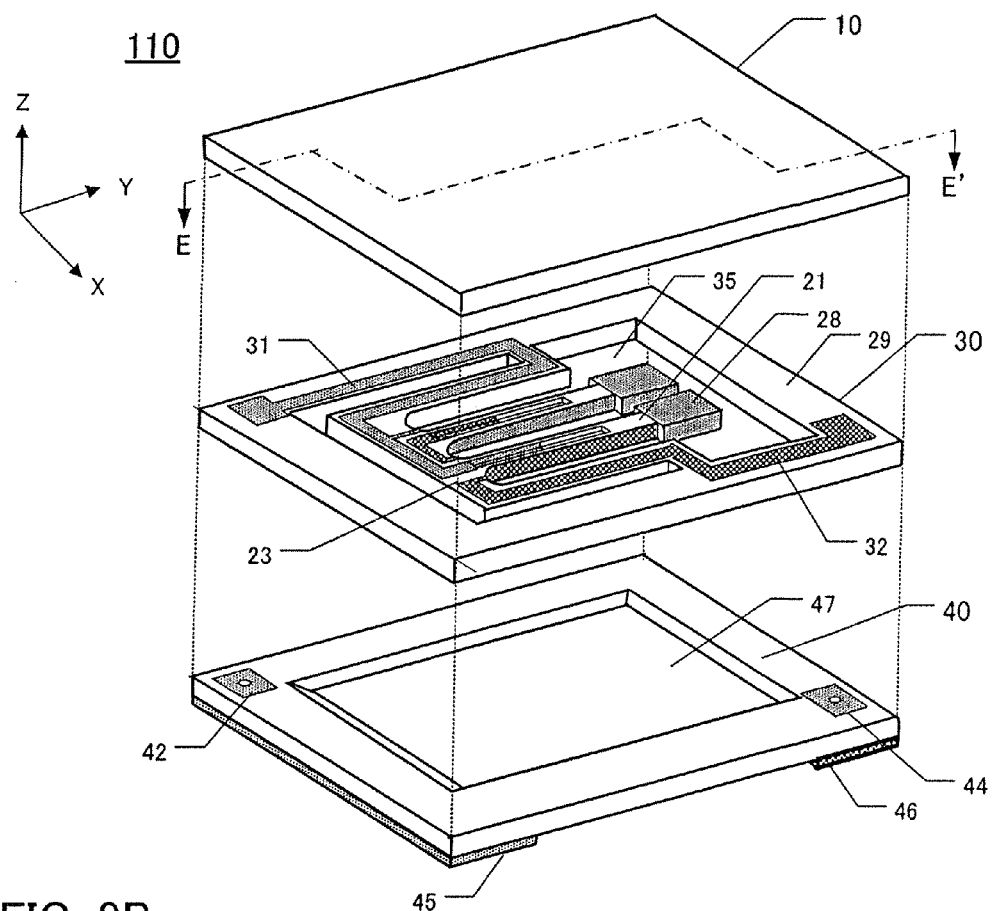
FIG. 9A is a perspective view of a second embodiment of a quartz-crystal device separated into constituent pieces, with the package lid being top-most.
Figure 9B:
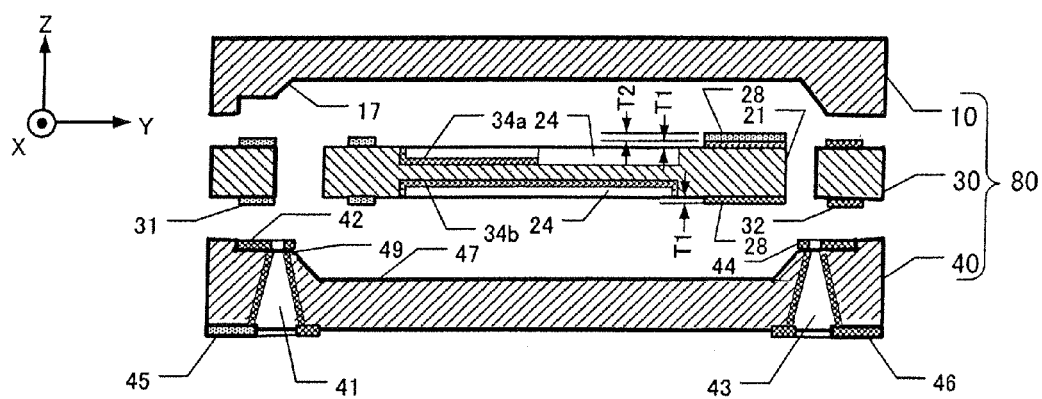
FIG. 9B is a cross-section of the quartz-crystal device of FIG. 9A, along the line E-E' in FIG. 9A.
Figure 10A:
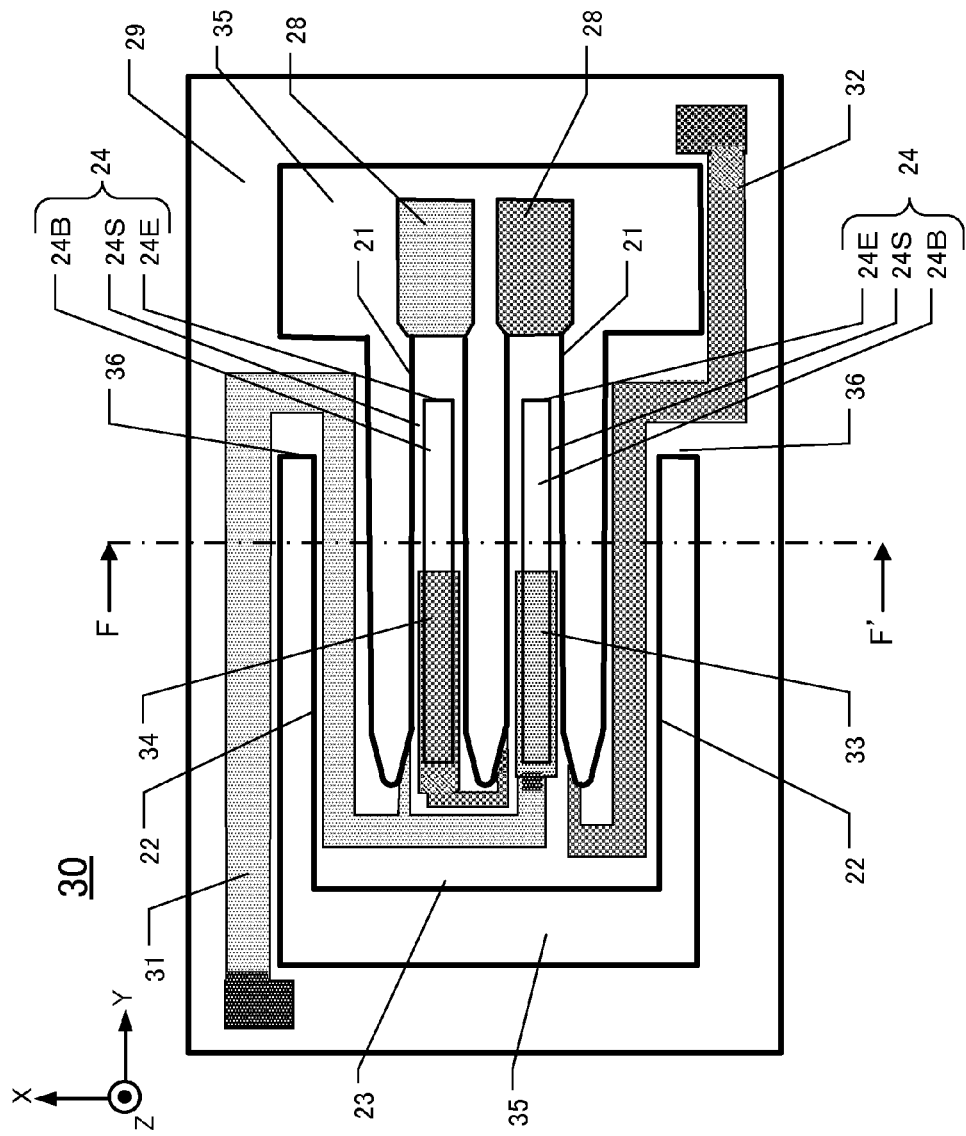
FIG. 10A is a plan view of a third embodiment of a tuning-fork type quartz-crystal vibrating piece.
Figure 10B:
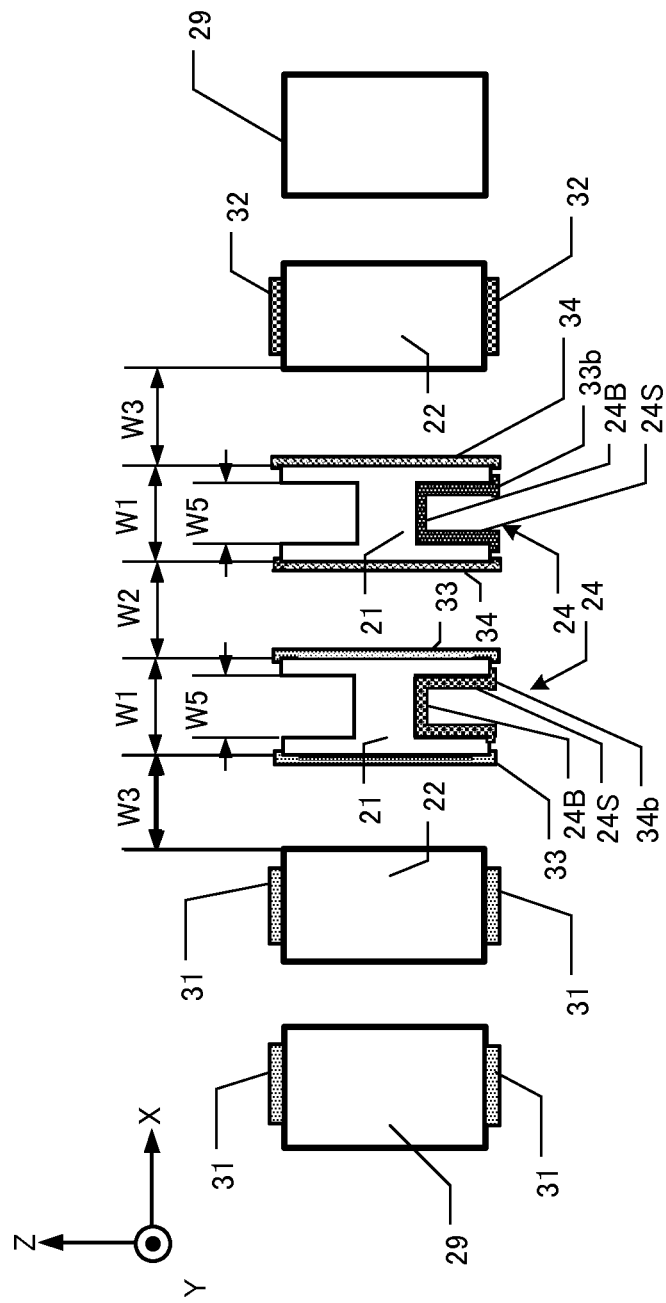
FIG. 10B is a cross-section of the tuning-fork type crystal vibrating piece of FIG. 10A, along the line F-F' in FIG. 10A.

FIG. 9A is a perspective view of a second embodiment of a quartz-crystal device 110, separated into individual pieces. FIG. 9B is a cross-section of the embodiment in FIG. 9A, along the line E-E' in FIG. 9A. FIG. 10A is a plan view of a third embodiment of a tuning-fork type quartz-crystal vibrating piece 30, and FIG. 10B is a cross-section of the embodiment of FIG. 10A along the line F-F'.

The second embodiment of a quartz-crystal device 110 comprises the third embodiment of a vibrating piece 30. The difference between the third embodiment of a vibrating piece 30 and the first embodiment of a vibrating piece 20 is the presence in the third embodiment of a tuning-fork type quartz-crystal vibrating piece 30. This embodiment comprises an outer frame that surrounds the base and vibrating arms. Other features of the third embodiment are similar to corresponding features of the first embodiment 20 and are not described further below.

As shown in FIGS. 9A and 9B, the second embodiment of a quartz-crystal device 110 comprises a package lid 10, the third embodiment of a vibrating piece 30, and a package base 40. The package lid 10, the vibrating piece 30, and the package base 40 are all fabricated from quartz-crystal materials.

In the second embodiment of a quartz-crystal device 110, the package lid 10 is situated above, the package base 40 is situated below, and the vibrating piece 30 is sandwiched between the lid and base, thereby forming a package 80. The package lid 10, package base 40, and vibrating piece 30 are sealed together by siloxane bonding (Si—O—Si).

Profile outlines and the vibrating arms of the third embodiment 30 of a vibrating piece 30 are formed by etching. An outer frame 29 is situated outside the vibrating arms 21, and a gap 35 is defined between the vibrating piece 30 and the outer frame portion 29. The gap 35 is formed by quartz-crystal etching. Respective supporting arms 22, extending from the base 23, are connected to the outer frame 29. The base electrodes 31, 32 are situated on the first principal surface of the base 23 and outer frame portion 29. Similarly, the base electrodes 31, 32 are formed on the second principal surface of the base.

A lid recess 17 is defined by the package lid 10 on the surface facing the vibrating piece 30. Similarly, a base recess 47 is defined by the package base 40 on the side facing the vibrating piece 30. The package base 40 defines a first through-hole 41, a second through-hole 43, and stepwise portions 49. A first connection electrode 42 and a second connection electrode 44 are formed on respective stepwise portion 49. Respective electrodes electrically connect the first through-hole 41 and the second through-hole 43 to respective first and second external electrodes 45, 46 located on the bottom surface of the package base 40.

Respective metal films are formed on inner surfaces of the first through-hole 41 and second through-hole 43. The metal films are formed during a photolithography step simultaneously with formation of the first connection electrode 42, second connection electrode 44, first external electrode 45, and second external electrode 46. The first connection electrode 42 is electrically connected to the first external electrode 45 by conduction through the package base 40 via the first through-hole 41. Similarly, the second connection electrode 44 is electrically connected to the second external electrode 46 by conduction through the package base 40 via the second through-hole 43.

The package 80 of the second embodiment 110 is formed by bonding together the package lid 10, the quartz-crystal vibrating piece 30, and the package base 40. Thus, the first base electrode 31 electrically connects to the first external electrode 45 on the package base 40, and the second base electrode 46 electrically connects to the second external electrode 46 on the package base 40.

The third embodiment of a tuning-fork type quartz-crystal vibrating piece 30 is essentially similar to the first embodiment of a vibrating piece 20, except for the configuration of the outer frame portion 29. In FIGS. 10A and 10B, excitation electrodes 33, 34 are not formed on the upper surface (+Z-surface) of grooves formed on each vibrating arm (viewed in cross-section along the line F-F'). Respective excitation electrodes 33b, 34b are formed on the lower main surface (−Z-surface) of each groove 24 (see FIG. 9B). Thus, respective excitation electrodes 33b, 34b are formed entirely on the lower main surfaces of the grooves 24. Excitation electrodes 33b, 34b are also formed on the side surfaces of the vibrating arms 21, on the side surfaces of the grooves 24S, and on the lower main surfaces 24B of the grooves 24.

The length n of the excitation electrodes of the third embodiment of a quartz-crystal vibrating piece 30 is more than 60% and less than 90% the length m of the groove 24, which is similar to the first embodiment of a vibrating piece 20. When forming the excitation electrodes 33, 34 on the third embodiment 30, the mask defining the electrodes may be misaligned on the quartz-crystal wafer. However, the third embodiment of a quartz-crystal vibrating piece 30 provides a twice-larger adjustment range compared to the two-sides cut vibrating piece, thereby further reducing the probability of a misalignment.

From a manufacturing point of view, the excitation electrodes 33a, 34a on the third embodiment of a vibrating piece 30 preferably face upward. With such an orientation of the excitation electrodes, metal particles produced by sputtering are correspondingly less likely to adhere to the excitation electrodes 33a, 34a during steps S13 and S17 in FIG. 4.

INDUSTRIAL APPLICABILITY

Representative embodiments are described above; however, it will be obvious to persons of ordinary skill in the relevant art to modify the invention based on this disclosure. For example, although the various embodiments have been described in the context of tuning-fork type quartz-crystal vibrating pieces, it will be understood that the embodiments can be applied with equal facility to piezoelectric materials such as lithium tantalite and lithium niobate. Furthermore, the present disclosure can be applied to piezoelectric oscillators that also include an IC configured as an oscillating circuit mounted inside the package on the package base.

What is claimed is:

1. A tuning-fork type quartz-crystal vibrating piece, comprising:

first and second vibrating arms extending from a first edge of a base in a predetermined direction and having respective weights on distal tips thereof;

respective first grooves defined on first principal surfaces of the vibrating arms, the first grooves being respective recesses extending in the predetermined direction and extending depthwise from the respective first principal surfaces; and respective second grooves defined on second principal surfaces, opposing the first principal surfaces, of the vibrating arms, the second grooves being respective recesses extending in the predetermined direction and extending depthwise from the respective second principal surfaces;

the first and second grooves each having a respective length and sides, a respective lower main surface, a respective back-edge surface located toward the base and a respective front-edge surface located toward the weight;

the first grooves include respective first excitation electrodes extending over the respective back-edge surface and on the respective sides and lower main surface toward the respective front-edge surface but not including the respective front-edge surface, the first excitation electrodes having a length that is less than the length of the first grooves;

the second grooves include respective second excitation electrodes extending over the respective back-edge surface to the respective front-edge surface, including the respective front-edge surface, respective side surfaces and respective lower main surfaces, the second excitation electrodes each having a length equal to the length of the respective second groove; and the length of the first excitation electrodes is less than the length of the second excitation electrodes.

2. The tuning-fork type piezoelectric vibrating piece of claim 1, wherein:

each weight comprises a first metal film formed, on the first principal surface, with a respective first thickness on the tip of each vibrating arm;

each weight comprises a second metal film formed, on the second principal surface, with a respective second thickness over the respective first metal film, the second principal surface being larger than the first principal surface; and the excitation electrodes have the first thickness.

3. The tuning-fork type quartz-crystal vibrating piece of claim 2, wherein the length of each first excitation electrode is in a range of 60%-90% the length of the respective first groove.

4. The tuning-fork type quartz-crystal vibrating piece of claim 2, wherein each weight is wider than the respective vibrating arm.

5. The tuning-fork type quartz-crystal vibrating piece of claim 2, wherein the first grooves and second grooves each include a respective constriction situated between the back-edge surface and front-edge surface, the constriction extending in a direction that crosses the predetermined direction and narrows the respective groove.

6. The tuning-fork type quartz-crystal vibrating piece of claim 1, wherein the length of the first excitation electrodes is in a range of 60%-90% the length of the respective first groove.

7. The tuning-fork type quartz-crystal vibrating piece of claim 6, wherein each weight is wider than the respective vibrating arm.

8. The tuning-fork type quartz-crystal vibrating piece of claim 6, wherein the first grooves and second grooves each include a respective constriction situated between the backedge surface and front-edge surface, the constriction extending in a direction that crosses the predetermined direction and narrows the respective groove.

9. The tuning-fork type quartz-crystal vibrating piece of claim 1, wherein each weight is wider than the respective vibrating arm.

10. The tuning-fork type quartz-crystal vibrating piece of claim 9, wherein the first grooves and second grooves each include a respective constriction situated between the back-edge surface and front-edge surface, the constriction extending in a direction that crosses the predetermined direction and narrows the respective groove.

11. The tuning-fork type quartz-crystal vibrating piece of claim 9, further comprising a respective supporting arm situated outboard of each vibrating arm, the supporting arms extending in the predetermined direction relative to the base and including respective bonding regions by which the vibrating piece is mountable using electrically conductive adhesive.

12. The tuning-fork type quartz-crystal vibrating piece of claim 9, further comprising:
    an outer frame surrounding the vibrating arms and base in two dimensions including the predetermined direction; and
    a respective supporting arm situated outboard of each vibrating arm, the supporting arms extending in the predetermined direction relative to the base, and the supporting arms being connected to the outer frame.

13. The tuning-fork type quartz-crystal vibrating piece of claim 1, wherein the first grooves and second grooves each include a respective constriction situated between the back-edge surface and front-edge surface, the constriction extending in a direction that crosses the predetermined direction and narrows the respective groove.

14. The tuning-fork type quartz-crystal vibrating piece of claim 1, further comprising a respective supporting arm situated outboard of each vibrating arm, the supporting arms extending in the predetermined direction relative to the base and including respective bonding regions by which the vibrating piece is mounted using electrically conductive adhesive.

15. The tuning-fork type quartz-crystal vibrating piece of claim 1, further comprising:
    an outer frame surrounding the vibrating arms and base in two dimensions including the predetermined direction; and
    a respective supporting arm situated outboard of each vibrating arm, the supporting arms extending in the predetermined direction relative to the base, and the supporting arms being connected to the outer frame.

16. A piezoelectric device, comprising:
a tuning-fork type quartz-crystal vibrating piece as recited in claim 1;
a base plate, situated opposite the second principal surface of the tuning-fork type piezoelectric vibrating piece, to which the tuning-fork type piezoelectric vibrating piece is mounted; and
a lid mounted to the first principal surface of the tuning-fork type piezoelectric vibrating piece.

17. A piezoelectric device, comprising:
a tuning-fork type quartz-crystal vibrating piece as recited in claim 2;
a base plate, situated opposite the second principal surface of the tuning-fork type piezoelectric vibrating piece, to which the tuning-fork type piezoelectric vibrating piece is mounted; and
a lid mounted to the first principal surface of the tuning-fork type piezoelectric vibrating piece.

18. A piezoelectric device, comprising:
a tuning-fork type quartz-crystal vibrating piece as recited in claim 6;
a base plate, situated opposite the second principal surface of the tuning-fork type piezoelectric vibrating piece, to which the tuning-fork type piezoelectric vibrating piece is mounted; and
a lid mounted to the first principal surface of the tuning-fork type piezoelectric vibrating piece.

19. A piezoelectric device, comprising:
a tuning-fork type quartz-crystal vibrating piece as recited in claim 9;
a base plate, situated opposite the second principal surface of the tuning-fork type piezoelectric vibrating piece, to which the tuning-fork type piezoelectric vibrating piece is mounted; and
a lid mounted to the first principal surface of the tuning-fork type piezoelectric vibrating piece.

20. A piezoelectric device, comprising:
a tuning-fork type quartz-crystal vibrating piece as recited in claim 12;
a base plate, situated opposite the second principal surface of the tuning-fork type piezoelectric vibrating piece, to which the tuning-fork type piezoelectric vibrating piece is mounted; and
a lid mounted to the first principal surface of the tuning-fork type piezoelectric vibrating piece.

* * * * *